United States Patent [19]

Yamagishi et al.

[11] Patent Number: 4,897,839
[45] Date of Patent: Jan. 30, 1990

[54] CODING AND DECODING METHOD

[75] Inventors: Atsuhiro Yamagishi; Hideo Yoshida; Tohru Inoue; Toshihisa Nishijima, all of Kanagawa; Yoshiaki Oda, Hyogo, all of Japan

[73] Assignee: Mitsubishi Denki Kabushiki Kaisha, Tokyo, Japan

[21] Appl. No.: 152,550

[22] Filed: Feb. 5, 1988

[30] Foreign Application Priority Data

Mar. 25, 1987 [JP] Japan .................................. 62-69037

[51] Int. Cl.$^4$ ............................................. G06F 11/10
[52] U.S. Cl. .................................................. 371/37.1
[58] Field of Search ...................... 371/37, 38, 39, 40, 371/57

[56] References Cited

U.S. PATENT DOCUMENTS

| | | | |
|---|---|---|---|
| 4,296,439 | 10/1981 | Teramura et al. | 371/57 |
| 4,494,234 | 1/1985 | Patel | 371/38 |
| 4,502,143 | 2/1985 | Kato et al. | 371/57 |
| 4,631,725 | 12/1986 | Takamura et al. | 371/39 |
| 4,694,455 | 9/1987 | Koga | 371/37 |
| 4,747,112 | 5/1988 | Blondeau, Jr. et al. | 375/20 |
| 4,750,179 | 6/1988 | Davidow et al. | 371/57 |

*Primary Examiner*—Charles E. Atkinson
*Attorney, Agent, or Firm*—Bernard, Rothwell & Brown

[57] ABSTRACT

Disclosed is a coding and decoding method, in which a certain promised nonzero symbol is appended for coding and decoding, thereby disallowing the presence of a codeword with all-"0" data after coding. The method enables the detection of a fault in an external circuitry by checking the occurrence of an all-"0" received word attributable to the external circuitry.

3 Claims, 5 Drawing Sheets

CODING AND DECODING METHOD

BACKGROUND OF THE INVENTION

1. Field of the Invention

The present invention relates to a coding and decoding method through the calculation of syndromes based on information symbols and, particularly, to a coding and decoding method intended for an error correction code.

2. Description of the Prior Art

FIG. 1 shows a block diagram of a conventional coding and decoding circuit which implements coding and decoding for the Reed-Solomon code, as disclosed for example in publication entitled "Theory of Coding" published by K. K. Shoko-Do on Sept. 20, 1973. In the figure, an input terminal 1 for information symbols for coding is connected to a retardation shift register 5 and the input of a syndrome calculation circuit 9. An output terminal 2 for codewords at coding is connected to the common contact of an output selector switch 6 for selecting an output of the information section or check symbol section. An input terminal 3 for received words at decoding is connected to a retardation shift register 7 for decoding and the input of the syndrome calculation circuit 9. An output terminal 4 for corrected information symbols at decoding is connected to the output of an adder 8 of finite field. The output of the retardation shift register 5 at coding is connected to the output selector switch 6. The output of the retardation shift register 7 at decoding is connected to one input of the adder 8, which has another input connected to the output of an error value calculation circuit 13. The syndrome calculation circuit 9 has its output connected to the input of a check symbol calculation circuit 10 and the input of an error location polynomial and error value polynomial generation circuit 11. The check symbol calculation circuit 10 has its output connected to another input contact of the output selector switch 6. The error location polynomial and error value polynomial generation circuit 11 has its outputs connected to the inputs of the error value calculation circuit 13 and the inputs of Chien's search algorithm circuit 12 for obtaining the roots of error location polynomial. The Chien's search algorism algorithm circuit 12 has an output connected to the input of the error value calculation circuit 13. A control circuit 14 for the overall coding/decoding circuit is in connection with the output selector switch 6, syndrome calculation circuit 9, check symbol calculation circuit 10, error location polynomial/error value polynomial generation circuit 11, Chien's search algorism circuit 12 and error value calculation circuit 13, so as to control this switch and circuits.

FIG. 2 is a detailed schematic diagram of the syndrome calculation circuit 9 shown in FIG. 1. In the figure, each AND gate 18 has its one input connected to an input terminal 15 for an information symbol at coding or received word at decoding, and another input connected to an input terminal 16 for the control signal used to make the check symbol section "0" at coding. The input terminals 15 and AND gates 18 are connected through eight lead wires. While for simplicity only one AND gate 18 has been shown in FIG. 1, in practice a plurality of AND gates are employed in the circuit, specifically, in the present circuit eight AND gates as indicated by the preceding sentence. The outputs of the AND gates 18 are connected to one inputs of adders 19 for finite field of t in number. Each of the adders 19 of t in number has another input connected to the output of a corresponding one of constant multiplying circuits 20 ($X\alpha^0$), ($X\alpha^1$), ..., ($X\alpha^{t-1}$) of t in number for a finite field. The output of each adder 19 is connected to the input terminal D of each of syndrome calculation registers 21 of t in number, which have output terminals Q connected to the inputs of the constant multiplying circuits 20 and to one input of syndrome outputting 3-state buffers 22. The 3-state buffers 22 of t in number have their outputs connected to the syndrome output terminals 17. A control circuit 23 has its one output connected to the inputs Reset terminal R of the syndrome calculation registers 21 and to another input of each of the 3-state buffers 22.

FIG. 3 shows in flowchart the coding operation. The following describes the conventional coding/decoding method based on the foregoing conventional coding/decoding circuit.

In the coding operation, an information symbol to be coded is entered through the input terminal 1 in FIG. 1, as shown by step 502 in the flowchart of FIG. 3.

Subsequently, in step 503, the information symbol is fed to the syndrome calculation circuit 9, so that syndromes are calculated based on the information symbol. The information symbol is also fed to the retardation register 5 for coding. In step 504, the syndrome produced by the syndrome calculation circuit 9 is entered to the check symbol calculation circuit 10 so that the check symbol is calculated.

In the next step 505, the information symbol released from the coding retardation shift register 5 is delivered as a codeword by way of the output selector switch 6 to the output terminal 2. When output of the information symbol has been completed, the control circuit 14 operates on the output selector switch 6 by the control signal to select the check symbol calculation circuit 10 so that the check symbol is delivered to the codeword output terminal, thereby completing the output of codeword, and the coding operation is terminated.

The above syndrome calculation will further be described with reference to FIG. 2. At the beginning of syndrome calculation, the control circuit 23 applies the control signal to the input terminal R of the syndrome calculation registers 21 so that they are cleared. After that, a high-level signal is entered to the control signal output terminal 16 so as to enable the AND gates 18, and dat of received word or information symbol intended to implement syndrome calculation is entered to the input terminal 15. The multipliers 20 and adders 19 for finite field calculate syndromes from the input data, and accumulate the results in the syndrome calculation registers 21. In case only information symbols have been entered, a low-level signal is entered through the control signal input terminal 16 at the section corresponding to the check symbol, thereby disabling the AND gates 18, so that all symbols corresponding to the check symbol are made "0". The calculated syndromes are delivered sequentially to the output terminal 17 by way of the syndrome outputting 3-state buffers 22.

In the foregoing conventional coding/decoding method, when information symbols are of all "0", the coding results in all-"0" data for the codeword. The presence of a codeword with all-"0" data causes the system to judge at decoding that a correct received word with all information symbols being "0" has been entered, even though the event of all-"0" might be derived from a fault of an external circuit, and as a problem the conventional method lacks in means for determining a faulty external circuitry.

SUMMARY OF THE INVENTION

The present invention is intended to overcome the foregoing prior art deficiency, and its prime object is to provide a coding/decoding method in which when information symbols of all-"0" data are coded, the resulting codeword does not become all-"0".

The present invention resides in the coding/decoding method in which a constant nonzero symbol is appended to the codeword at coding, the codeword with the appended symbol being removed is transmitted, and the constant nonzero symbol is appended to the received word on the part of the receiver.

Other objects and advantages of the present invention will become more apparent from the following description of the specific embodiment taken in conjunction with the accompanying drawings.

DESCRIPTION OF THE PREFERRED EMBODIMENT

Figure 4:
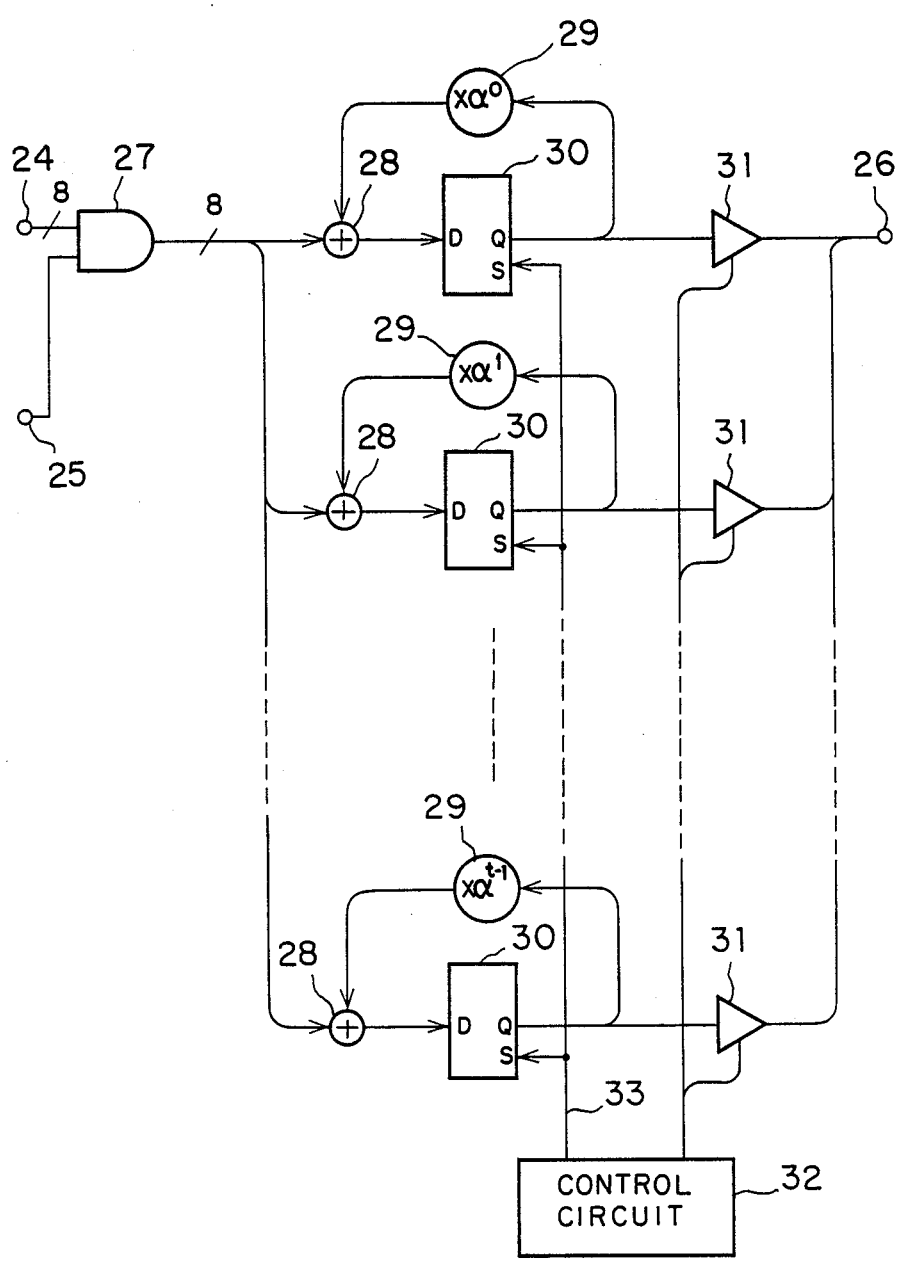
FIG. 4 is a schematic diagram of the syndrome calculation circuit embodying the present invention.

In FIG. 4 showing the syndrome calculation circuit used in an embodiment of this invention, each AND gate 27 has its one input connected to a received word input terminal 24 and another input connected to an input terminal 25 for the control signal for making the check symbol section to become "0" at coding. The outputs of AND gates 27 are connected to corresponding inputs of adders 28 for finite field of t in number. The adders 28 of t in number each have another input connected to the output of constant multipliers 29 ($X\alpha^0$), ($X\alpha^1$), ..., ($X\alpha^{t-1}$) for the finite fields of t in number. The output of each adder 28 is connected to the input terminal D of each of syndrome calculation registers 30 of t in number, which have output terminals Q connected to the inputs of the constant multipliers 29 and to one inputs of each of the syndrome outputting 3-state buffers 31, which have outputs connected to the syndrome output terminal 26.

Figure 2:
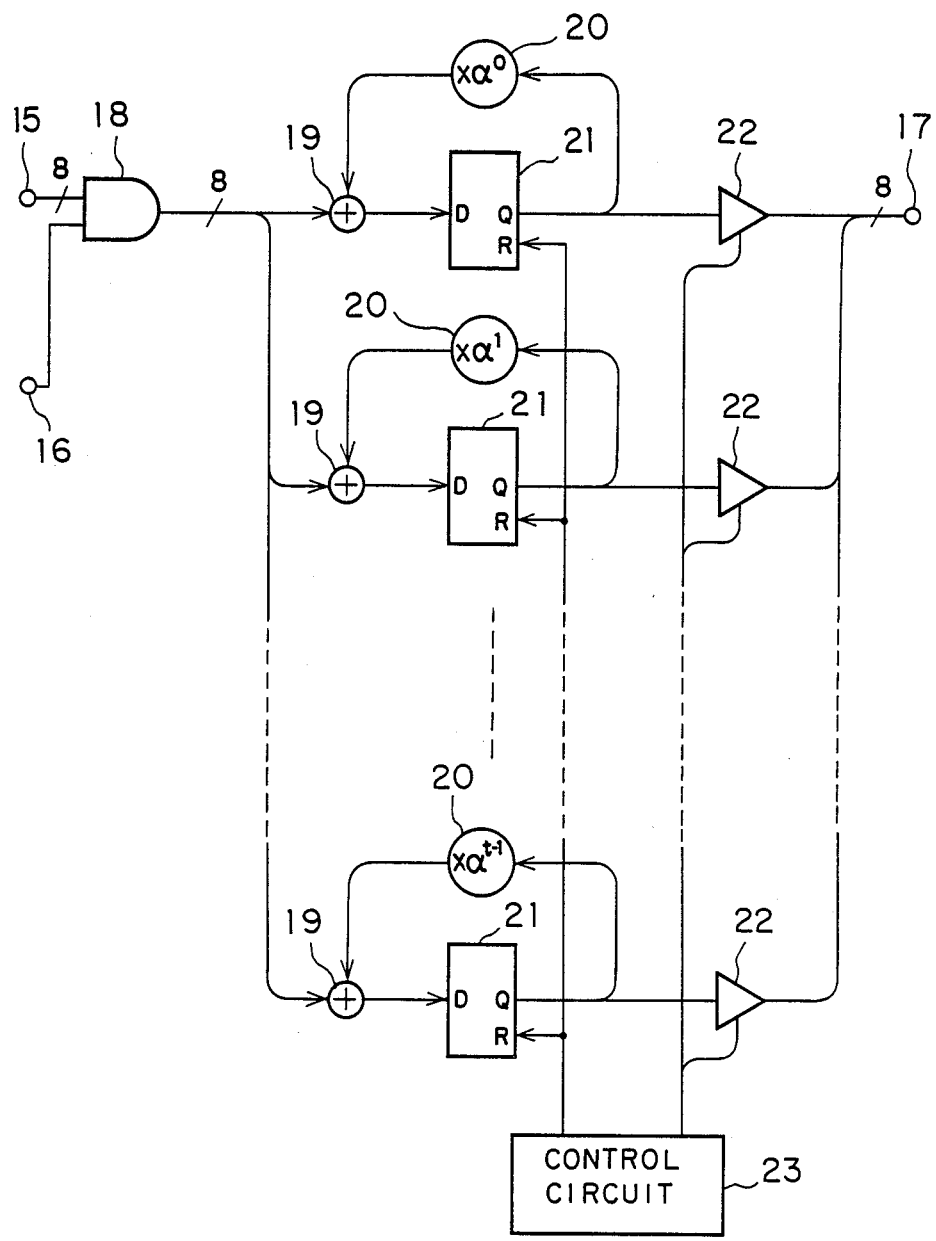
FIG. 2 is a block diagram of the conventional syndrome calculation circuit.
Figure 3:
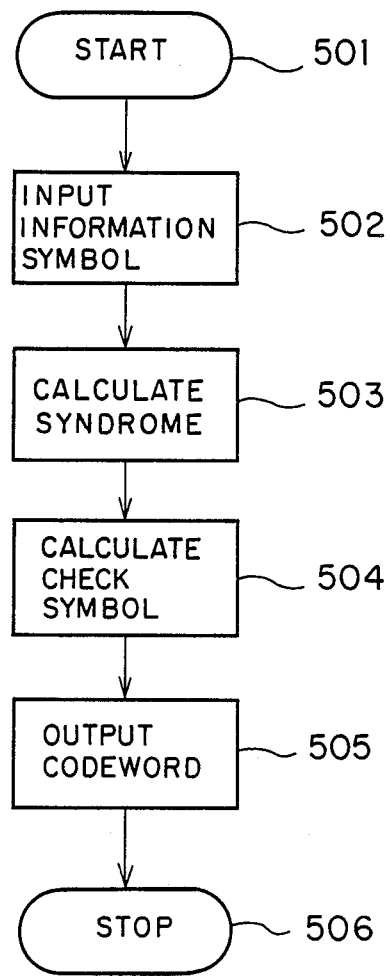
FIG. 3 is a flowchart used to explain the coding operation by the arrangement of FIG. 1.

A syndrome control circuit 32 has its one output connected to the set terminal S of each syndrome calculation registers 30 through a signal line 33 which is used to set a certain nonzero constant to the syndrome calculation registers 30, and another output connected to another input of each of the 3-state buffers 31. The AND gates 27 provide their outputs on eight output wires. As in the case of FIG. 2 only one AND gate 27 has been illustrated in FIG. 4 for simplicity.

Figure 5:
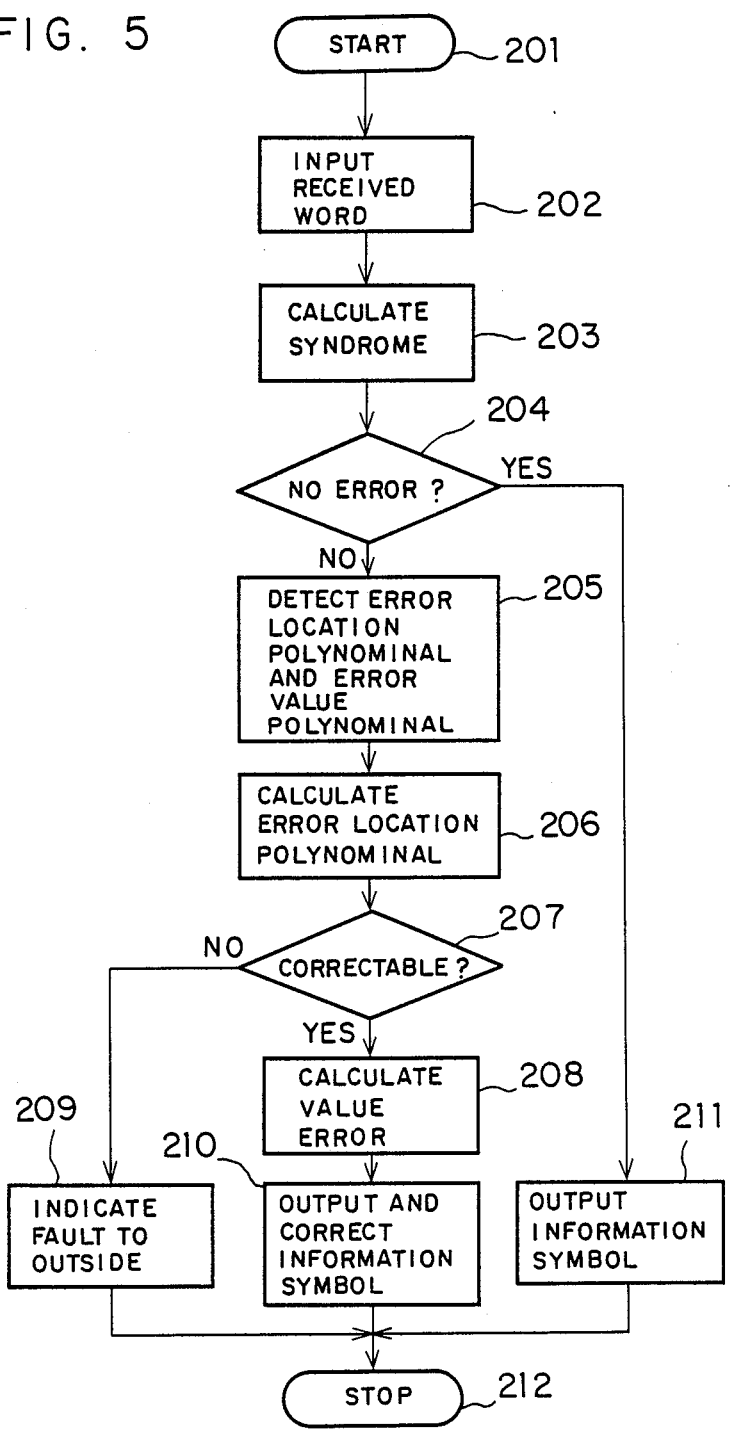
FIG. 5 is a flowchart used to explain the decoding operation according to the present invention.

FIG. 5 shows in flowchart the decoding operation.

Figure 1:
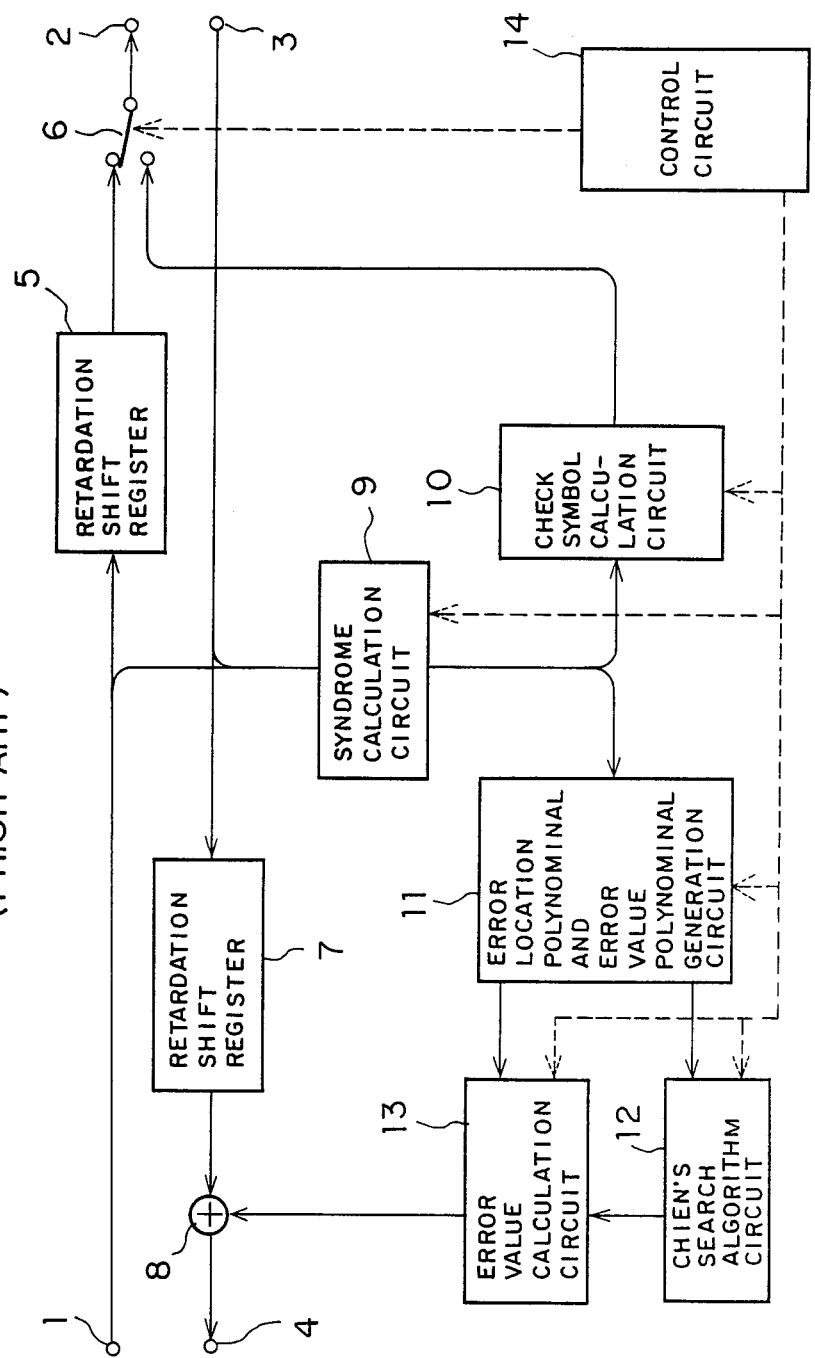
FIG. 1 is a block diagram of the conventional coding/decoding circuit.

The inventive coding/decoding method is practiced by employing the circuit arrangement of FIG. 4 for the syndrome calculation circuit 9 in FIG. 1. The operation will be described in connection with FIGS. 1 and 4 by taking an example of Reed-Solomon code (12, 8, 5) on GF(2 4) having a source polynomial $X^4+X+1$ and generation polynomial $$G(X) = \sum_{i=0}^{3} (X + \alpha^i).$$

In coding a string of information symbols (0,0,0,0, 0,0,0,0), these symbols are entered through the input terminal 1. The entered information symbols are fed to the coding retardation shift register 5 and syndrome calculation circuit 9. After the syndrome calculation registers 30 in the syndrome calculation circuit 9 have been set to a certain nonzero constant A by way of the signal line 33, the control signal input terminal 25 is brought to a high level so as to enable the AND gates 27, and the entered information symbols on the input terminal 1 are fed to the input terminal 24. For the section corresponding to the check symbol, the control signal input terminal 25 is brought to a low level so that the check symbol section is made "0" for calculation. With the information symbols being $I_0, I_1, \ldots, I_7$ expediently, the calculated syndromes are expressed by the following formula.

$$S_i = A(\alpha^{12})^i + \sum_{j=0}^{11} I_j (\alpha^{11-j})^i \quad (1)$$

$$[i = 0, 1, 2, 3]$$

Since the information symbols are (0,0,0,0,0,0,0,0), i.e., all zeros for $I_0$ through $I_7$, the resulting syndromes $S_0, S_1, S_2$ and $S_3$ are A, $A\alpha^{12}$, $A\alpha^{24}$ and $A\alpha^{36}$, respectively.

The calculated syndromes are entered to the check symbol calculation circuit 10, which then implements the following computation.

$$\begin{bmatrix} P_0 \\ P_1 \\ P_2 \\ P_3 \end{bmatrix} = \begin{bmatrix} 1 & 1 & 1 & 1 \\ \alpha^3 & \alpha^2 & \alpha & 1 \\ \alpha^6 & \alpha^4 & \alpha^2 & 1 \\ \alpha^9 & \alpha^6 & \alpha^3 & 1 \end{bmatrix}^{-1} \begin{bmatrix} S_0 \\ S_1 \\ S_2 \\ S_3 \end{bmatrix} = \quad (2)$$

$$\begin{bmatrix} \alpha^4 & \alpha^{12} & \alpha^{11} & \alpha \\ 1 & \alpha^{10} & \alpha^3 & \alpha^{11} \\ \alpha^2 & \alpha^6 & \alpha^{10} & \alpha^{12} \\ \alpha^{10} & \alpha^2 & 1 & \alpha^4 \end{bmatrix} \begin{bmatrix} S_0 \\ S_1 \\ S_2 \\ S_3 \end{bmatrix}$$

where $P_0, P_1, P_2, P_3$ are check symbols, and $S_0, S_1, S_2, S_3$ are syndromes. Substituting the calculated syndromes A, $A\alpha^{12}$, $A\alpha^{24}$ and $A\alpha^{36}$ to formula (2) results as follows.

$$\begin{bmatrix} P_1 \\ P_1 \\ P_2 \\ P_3 \end{bmatrix} = \begin{bmatrix} \alpha^4 & \alpha^{12} & \alpha^{11} & \alpha \\ 1 & \alpha^{10} & \alpha^3 & \alpha^{11} \\ \alpha^2 & \alpha^6 & \alpha^{10} & \alpha^{12} \\ \alpha^{10} & \alpha^2 & 1 & \alpha^4 \end{bmatrix} \begin{bmatrix} A \\ A\alpha^{12} \\ A\alpha^{24} \\ A\alpha^{36} \end{bmatrix} = A \begin{bmatrix} \alpha^2 \\ 1 \\ \alpha^{10} \\ \alpha^4 \end{bmatrix} \quad (3)$$

Namely, unless the constant A is "0", coding of information symbols of all-"0" data does not yield all "0" check symbols.

The information symbols shifted out of the coding retardation shift register 5 are delivered by way of the output selector switch 6 to the output terminal 2 for the codeword. After that, the output selector switch 6 is switched to select the output of the check symbol calculation circuit 10 so that the calculated check symbols are outputted. Then, the codeword provided on the output terminal 2 will be (0,0,0,0,0,0,0,0, $A\alpha^2$, A, $A\alpha^{10}$, $A\alpha^4$).

Next, the case of entry of a received word (0,0,0,0, 0,0,0,0,0,0,0,0) at coding created by a fault of an external circuit will be described in connection with the flowchart of FIG. 5.

In step 202, the received word is entered through the input terminal 3. Subsequently, in step 203, the entered word is fed to the retardation shift register 7 for decoding and the syndrome calculation circuit 9 so that its syndromes are computed. The syndrome calculation circuit 9 has its syndrome calculation registers 30 set to the same nonzero constant A as in coding through the signal line 33 shown in FIG. 4. With the received word being $(\gamma_0, \gamma_1, \ldots, \gamma_{11})$ expediently, the calculated syndromes are expressed as follows.

$$Si = A(\alpha^{12})^i + \sum_{j=0}^{11} \gamma_j (\alpha^{11-j})^i \quad (4)$$

$$[i = 0, 1, 2, 3]$$

For the received word (0,0,0,0,0,0,0,0,0,0,0,0) created under the failure of external circuit, the calculated syndromes $S_0$, $S_1$, $S_2$ and $S_3$ become A, $A\alpha^{12}$, $A\alpha^{24}$ and $A\alpha^{36}$, respectively. This result is examined for validity in step 204. In this case, the calculated syndromes are judged to include error, and the control sequence proceeds to the next step 205, in which the syndromes are entered to the error location polynomial and error value polynomial generation circuit 11. The circuit 11 detects the occurrence of a single error, and the generated error location polynomial and error value polynomial are sent to the Chien's search algorithm circuit 12 and error value calculation circuit 13, respectively.

In step 206, roots of the error location polynomial are calculated by the Chien's search algorithm circuit 12, and it is judged in step 207 as to whether the calculated roots are correctable. In this example, the calculated roots of error location polynomial indicate the location where the nonzero constant A is appended, i.e., the location preceded by one symbol, whereby it is known that an infeasible, uncorrectable word (0,0, ..., 0) has been received. Consequently, the occurrence of the fault in the external circuit is detected, and it is indicated to the outside in step 209.

Next, the case of reception of a word including an error, instead of a faulty external circuit, will be described. This is the case where the entered received word is a codeword coded inclusive of the nonzero constant A, but containing an error caused by noises or the like. Although the calculated syndromes $S_0$, $S_1$, $S_2$ and $S_3$ indicate the presence of error, when the error is correctable as a result of calculation by the Chien's search algorithm circuit 12 based on the error location polynomial generated by the error location polynomial and error value polynomial generation circuit 11, the root of the error location polynomial surely indicates any position within the received word. (This is because the symbol with the nonzero constant A appended is not erroneous). Accordingly, the control sequence proceeds from step 207 to step 208, in which the calculated roots of error location polynomial are entered to the error value calculation circuit 13 so that the error value is calculated, the received word and the error value are merged at the position indicated by the roots of error location polynomial for the received word provided by the retardation shift register 7 for coding with the adders 8 for finite field thereby to correct the error, and the corrected information symbols are outputted through the output terminal 4 (step 210).

Finally, the case of reception of a word without the occurrence of fault in the external circuit and without including error will be described. In this case, the entered received word is a coded codeword itself including the nonzero constant A. The received word is introduced through the input terminal 3 and fed to the retardation shift register 7 for decoding and to the syndrome calculation circuit 9. Calculation by the syndrome calculation circuit 9 results in all-"0" syndromes $S_0$, $S_1$, $S_2$ and $S_3$, and validity of the received word is determined (step 204). Since the received word given to the retardation shift register 4 for decoding has been judged to be correct, the contents of the retardation shift register 7 for decoding are outputted as information symbols without any correction through the output terminal 4 (step 211).

Although in the foregoing embodiment the syndrome calculation is adopted for coding, a circuit arrangement having an independent coding circuit also attains the same result.

Although in the foregoing embodiment, a certain nonzero constant is appended at the top of information symbols, the same effect is of course attained when such a constant is appended at an arbitrary position of information symbols.

As described above, the inventive method implements coding and decoding by appending a nonzero constant to information symbols, which disallows the presence of a codeword with all-"0" symbols, whereby the method makes possible the detection of a fault in external circuitry.

What is claimed is:

1. A coding and decoding method, comprising the steps of:
   calculating syndromes for a string of information symbols utilizing a nonzero constant in the syndrome calculation;
   computing check symbols for each of the calculated syndromes;
   transmitting a code word containing said information symbols and said check symbols;
   receiving a transmitted code word;
   calculating syndromes for said received code word utilizing a nonzero constant in the syndrome calculation;
   determining the existence of an uncorrectable error in said received word when said nonzero constant is appended to a calculated syndrome at a predetermined position;
   determining the existence of a correctable error in said received word when said nonzero constant is appended to a calculated syndrome at other than said predetermined position; and
   determining the absence of error in said received word when the calculated syndromes are all zero.

2. In a coding and decoding method utilizing the calculation of syndromes based on information symbols, the improvement comprising:

determining the existence of a code word containing all "0" information symbols; and appending a certain nonzero constant to said code word containing all "0" information symbols such that a check symbol section does not become "0".

3. A coding and decoding method according to claim 1, wherein when the syndromes are calculated, a syndrome calculating register is used to implement a syndrome calculation starting at a nonzero state of said syndrome calculating register.

* * * * *

UNITED STATES PATENT AND TRADEMARK OFFICE
CERTIFICATE OF CORRECTION

PATENT NO. : 4,897,839

DATED : January 30, 1990

INVENTOR(S) : ATSUHIRO YAMAGISHI ET AL.

It is certified that error appears in the above-identified patent and that said Letters Patent is hereby corrected as shown below:

Col. 2, line 49, "dat" should be --data--.

Col. 4, line 5, delete "$\sum$" and insert --$\pi$--.

Signed and Sealed this

Sixteenth Day of July, 1991

*Attest:*

HARRY F. MANBECK, JR.

*Attesting Officer*      *Commissioner of Patents and Trademarks*